United States Patent
Malcom et al.

(10) Patent No.: US 10,635,144 B2
(45) Date of Patent: Apr. 28, 2020

(54) POWER DISTRIBUTION ASSEMBLY WITH ATTACHMENT MODULES

(71) Applicant: Sumitomo Wiring Systems, Ltd., Yokkaichi, Mie (JP)

(72) Inventors: Bennie J. Malcom, Farmington Hills, MI (US); Brian D. Carnick, Farmington Hills, MI (US); Hala Qola, Farmington Hills, MI (US)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 11 days.

(21) Appl. No.: 16/057,058

(22) Filed: Aug. 7, 2018

(65) Prior Publication Data

US 2020/0050245 A1 Feb. 13, 2020

(51) Int. Cl.
*H01R 12/00* (2006.01)
*G06F 1/18* (2006.01)
*H05K 7/14* (2006.01)

(52) U.S. Cl.
CPC .............. *G06F 1/189* (2013.01); *G06F 1/186* (2013.01); *H05K 7/1457* (2013.01)

(58) Field of Classification Search
CPC ....... G06F 1/189; G06F 1/186; H05K 7/1457; H05K 5/0026; H01R 9/226
USPC ............................................... 439/76.1, 76.2
See application file for complete search history.

(56) References Cited

U.S. PATENT DOCUMENTS

| | | | | |
|---|---|---|---|---|
| 2,091,773 A | * | 8/1937 | Travers | H05K 5/0091 439/535 |
| 5,057,971 A | * | 10/1991 | Hautvast | H05K 5/0065 174/59 |
| 5,521,792 A | * | 5/1996 | Pleitz | H05K 7/20854 361/690 |
| 9,293,870 B1 | * | 3/2016 | Koczwara | H05K 5/0069 |
| 9,942,996 B2 | * | 4/2018 | Kojima | H05K 5/0052 |

\* cited by examiner

*Primary Examiner* — Khiem M Nguyen
(74) *Attorney, Agent, or Firm* — Honigman LLP

(57) ABSTRACT

A power distribution assembly having a box and at least a pair of attachment modules is provided. The box includes a pair of mating structures. The attachment modules have an attachment body which may be configured to attach to a specific packaging space and an attachment portion configured to engage a specific mating structure of the box. Accordingly, the same box may be used for different applications wherein only the attachment module is customized, as described in greater detail further below.

20 Claims, 4 Drawing Sheets

POWER DISTRIBUTION ASSEMBLY WITH ATTACHMENT MODULES

TECHNICAL FIELD

The present specification generally relates to power distribution assemblies, and more particularly to power distribution assemblies having a modular attachment structure configured to reduce manufacturing costs.

BACKGROUND

In general, power distribution assemblies include a box for storing electric components configured to distribute power to various electric components. The power is distributed using commonly known components such as switches, relays, fuses, capacitors, resistors and the like. The power distribution assembly may be used in various applications. For instance, one power distribution assembly may be used to distribute power to an instrument panel of an automotive vehicle, whereas another power distribution assembly may be used to distribute power to specific electric devices, such as a power folding mirror, headlights or the like.

The dimension of the box is generally the same. However, the attachment structure of the power distribution assembly is customized to accommodate different packaging spaces, different boxes are manufactured for specific application. Accordingly, it remains desirable to have a power distribution assembly wherein a common box may be used for various applications.

SUMMARY

In one embodiment, a power distribution assembly having a box and a plurality of attachment features is provided. The attachment features are configured to attach to the walls of the box, and includes a key configured to engage a specific mating structure of the wall of the box. Accordingly, the same box may be used for different applications wherein only the attachment structure is customized.

In one embodiment, the box includes a first side wall, a second side wall, a first back wall and a first back wall so as to define a first, second, third and fourth corner. The box further includes a first corner mating structure, a second corner mating structure, a third corner mating structure and a fourth corner mating structure. The first, second, third and fourth corner mating structures are different from each other.

The power distribution assembly may further include an attachment module configured to lock with a first, second, third or fourth corner mating structure. In one aspect, the power distribution assembly includes a first corner attachment module, a second corner attachment module, a third corner attachment module and a fourth corner attachment module. The first, second, third and fourth corner attachment module each includes an attachment portion and a respective first, second, third and fourth key. The first, second, third and fourth key are disposed on an inner surface of the attachment portion. The first, second, third and fourth key are configured to lock with a respective first, second, third and fourth corner mating structure of the first, second, third and fourth corner.

In one embodiment, the power distribution assembly further includes a first and a second side wall attachment module. The first and second side wall attachment module includes an attachment portion and a respective first and second side wall key. The first side wall and the second side wall each include a first and second side wall mating structure. The first and second side wall mating structures are different from each other. The first and second side wall keys are configured to lock with a respective first and second side wall mating structures.

Accordingly, the power distribution assembly is configured to have a common box adaptable for use in various packaging spaces so as to reduce manufacturing costs. In particular, the attachment modules may be manufacture with a fixed key whereas the attachment structure is modified to account for a predetermined packaging space.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION

Referring generally to the figures, embodiments of the present disclosure include a power distribution assembly having a box and a pair of attachment modules is provided. The box includes a pair of mating structures. The attachment modules have an attachment body which may be configured to attach to a specific packaging space and an attachment portion configured to engage a specific mating structure of the box. Accordingly, the same box 12 may be used for different applications wherein only the attachment module 14 is customized, as described in greater detail further below.

As used herein the terms front and back are made in reference to the orientation of the related part when the retaining system is assembled, wherein the front refers to the portion of the part facing the other during assembly and the back refers to the portion of the part facing away from the front. The term top and bottom refer to the orientation of the part as shown in the figures. An element described herein may be referenced generally by a number and specifically by the same number followed by a letter. For example an attachment module is referenced generally by the number 14, whereas a specific attachment module is referenced by 14a, 14b, 14c or 14d as the case may be.

Figure 1:
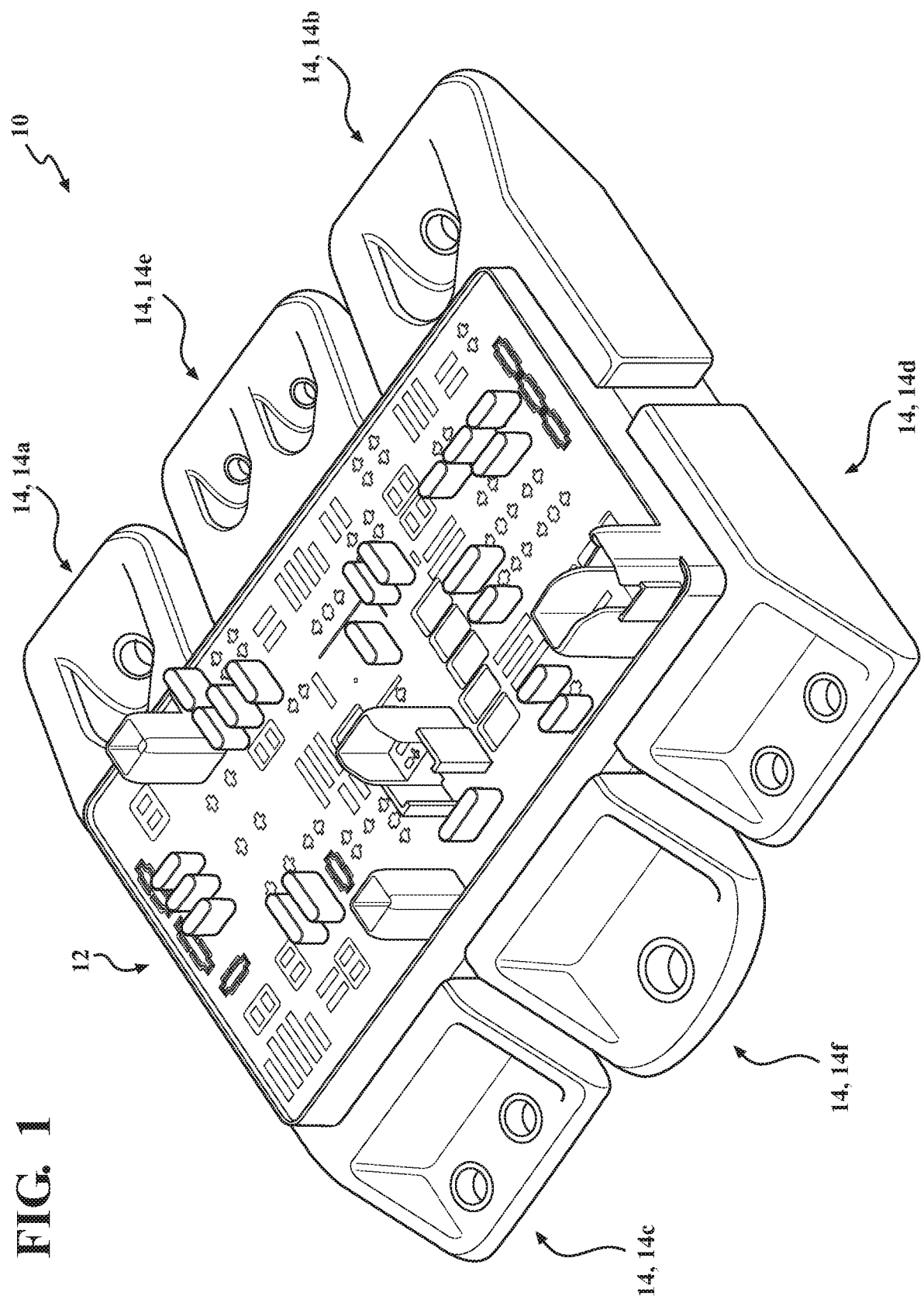
FIG. 1 schematically depicts a power distribution assembly according to one or more embodiments illustrated herein.
Figure 2:
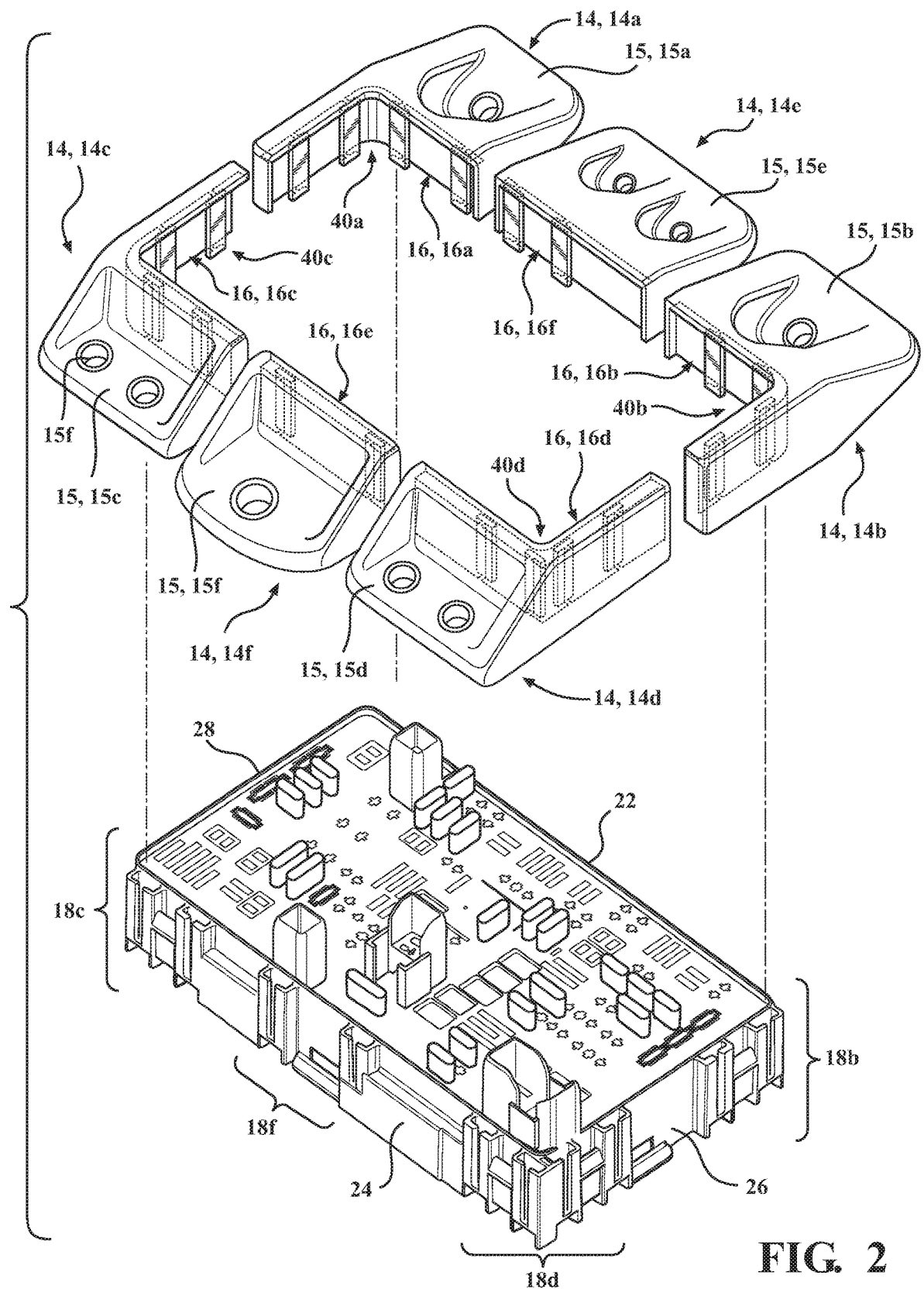
FIG. 2 is an exploded view of the power distribution assembly shown in FIG. 1.

With reference now to FIGS. 1 and 2, a power distribution assembly 10 having a box 12 and a plurality of attachment modules 14 is provided. The box 12 includes an outer wall 20 having an outer wall surface 20a. The outer wall 20 includes a first side wall 22, a second side wall 24, a first back wall 26 and a first front wall 28 so as to define a first, second, third and fourth corner 30, 32, 34, 36. For illustrative purposes, the box 12 is shown as having a length "L" longer than the width "W". A top of the box 12 is open and includes a plurality of storage spaces 38 configured to receive electric components (not shown). The electric components are configured to direct power, such as relays, switches and the like. The first side wall 22, second side wall 24, first back wall 26 and first front wall 28 are generally planar members orthogonal to each other so as to form a generally cubic dimension.

Figure 3:
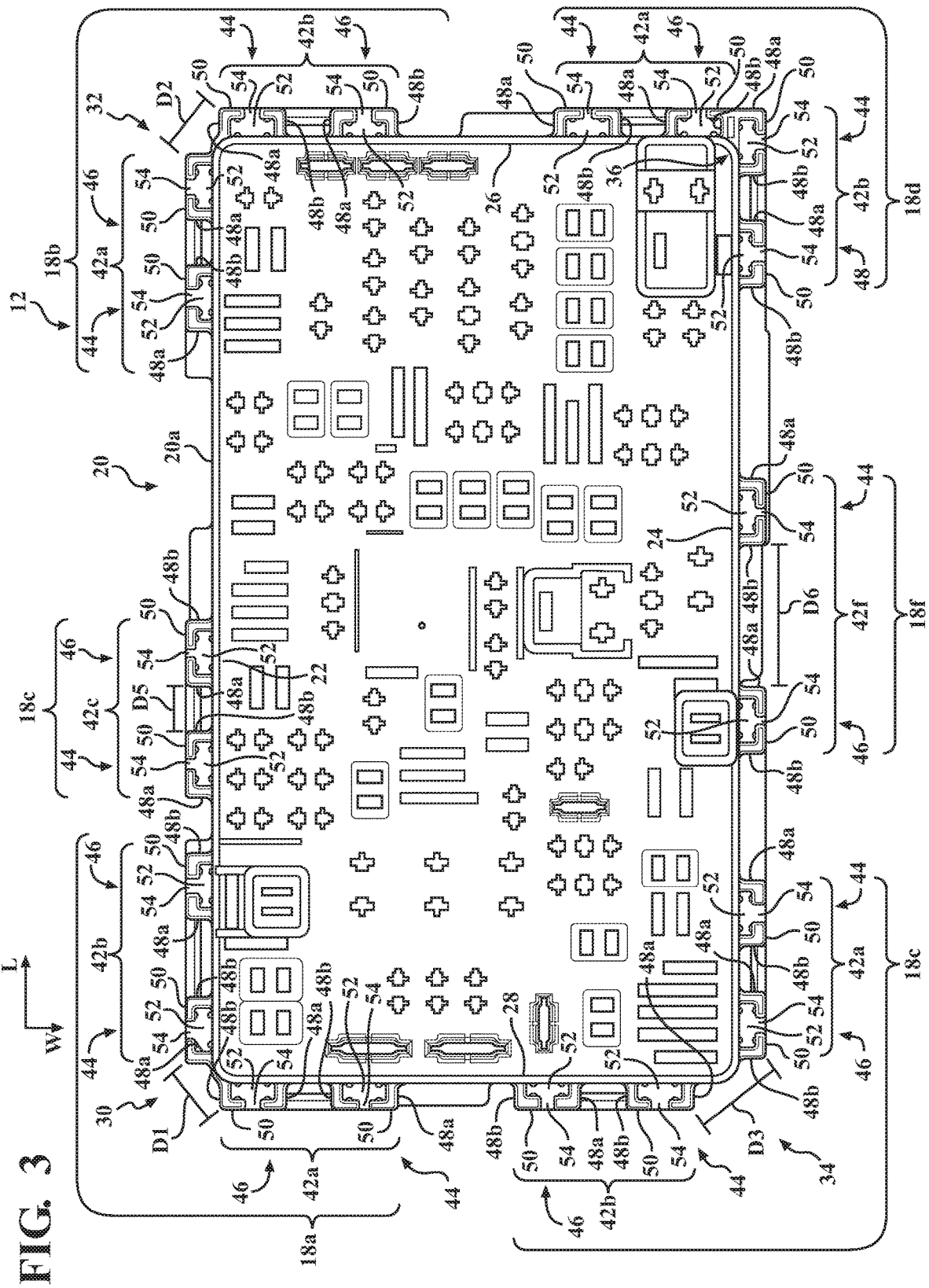
FIG. 3 is a top down view of the box.

With reference again to FIG. 2 and now to FIG. 3, the box 12 further includes a first mating structure 18a, a second mating structure 18b, a third mating structure 18c and a fourth mating structure 18d. The first, second, third and fourth mating structures 18a, 18b, 18c, 18d are disposed on respective corners 30, 32, 34, 36 of the box 12. For example, the first mating structure 18a is disposed on corner 30 where the first side wall 22 and the first front wall 28 are joined. The first, second, third and fourth mating structures 18, 18b, 18c, 18d are structurally different from each other.

With reference again to FIGS. 1 and 2, the power distribution assembly 10 further includes a first corner attachment module 14a, a second corner attachment module 14b, a third corner attachment module 14c and a fourth corner attachment module 14d. The first, second, third and fourth corner attachment modules 14a, 14b, 14c, 14d each include an attachment body 15a, 15b, 15c, 15d. The attachment bodies 15a, 15b, 15c, 15d are shown dimensioned differently from each other to illustratively depict how the attachment bodies 15 are customized for a specific packaging space. The attachment bodies 15 may include through-bores 15f for receiving a fastener such as a bolt or screw (not shown) to secure the attachment body 15 to a predetermined mounting structure within the packaging space. It should be appreciated that the attachment bodies 15 may be L-shaped or include portions which extend outwardly so as to position the fastener to predetermined space and that the dimension of the attachment bodies 15 shown herein are illustrative.

Each attachment portion 16 includes a key 40 configured to engage the mating structure 18. In particular each attachment portion 16a, 16b, 16c, 16d includes a corresponding first, second, third and fourth key 40a, 40b, 40c, 40d disposed on an inner surface of the respective attachment portion 16a, 16b, 16c, 16d. The first, second, third and fourth key 40a, 40b, 40c, 40d are configured to lock with a respective first, second, third and fourth mating structure 18a, 18b, 18c, 18d so as to be engaged with a corresponding first, second, third and fourth corners 30, 32, 34, 36 of the box 12. Accordingly, the power distribution assembly 10 is configured to ensure that the proper corner attachment module 14 is mounted to the proper corner 30, 32, 34, 36 of the box 12. The figures provide an illustrative example of first, second, third and fourth keys 40a, 40b, 40c, 40d, and first, second third, and fourth mating structures 18a, 18b, 18c, 18d. However, it should be appreciated that the keys 40 and mating structure 18 shown herein are illustrative and not limiting. The keys 40 are generally depicted in FIG. 2 and are more clearly shown in FIGS. 4A-5B and discussed in more detail below.

In one embodiment, each of the mating structures 18 includes a pair of guides 42. In one aspect, the guides 42 have a first slot housing 44 spaced apart from a second slot housing 46. The first and second slot housings 44, 46 each have a pair of slot side walls 48a, 48b and a front slot wall 50 spaced apart from an outer surface of the outer wall 20 so as to form a pocket 52 with an open top. The front slot wall 50 includes a slot 54. The slot 54 extends along the longitudinal height of the slot side walls 48 and is generally centered between the slot side walls 48.

With reference now to FIG. 3, a top down view of the box 12 is shown depicting all of the mating structures 18. As discussed above, the mating structure 18 is illustratively shown as a pair of guides 42, each guide 42 having a first slot housing 44 and second slot housing 46. One of the pair of guides 42a of the first mating structure 18a is disposed on a first front wall 28 of the outer wall 20 and the other guide 42b of the first mating structure 18 is disposed on the first side wall 22 of the outer wall 20. One of the pair of guides 42a of the second mating structure 18b is disposed on a first front wall 28 of the outer wall 20 and the other guide 42b of the second mating structure 18b is disposed on the second side wall 24 of the outer wall 20. One of the pair of guides 42a of the third mating structure 18c is disposed on a first back wall 26 of the outer wall 20 and the other guide 42b is disposed on the first side wall 22 of the outer wall 20. One of the pair of guides 42a of the fourth mating structure 18d is disposed on a first back wall 26 of the outer wall 20 and the other guide 42b is disposed on the second side wall 24 of the outer wall 20.

The mating structures 18 are different in dimension than each other. In one aspect, the mating structures 18 have the same components, but the components have different dimensions. The mating structures 18 may be made different from each other by differing the dimension of the pocket 52, or the displacement of one guide 42 with respect to the other. FIG. 3 illustrates one aspect in wherein the guides 42a, 42b are spaced apart different distances from each other.

For example, the first mating structure 18a has one guide 42a that is flush to the edge of the first front wall 28 and the other guide 42b is disposed on the first side wall 22 and spaced apart from the edge of the first front wall 28 so as to be a distance D1 from guide 42a. The second mating structure 18c has guides 42a, 42b spaced apart from each other a distance D2, wherein both of the guides 42a, 42b abut against the second corner 32 of the box 12. The third mating structure 18c has guides 42a, 42b spaced apart from each other a distance D3 wherein both of the guides 42a, 42b are spaced apart from the third corner 34 of the box 12. The fourth mating structure 18 has guides 42a, 42b that abut against each other, wherein guide 42b extends beyond an outer surface of the first back wall 28. Thus, an attachment module 14 configured to engage mating structure 18a cannot also engage any of the other mating structures 18b, 18c or 18d. Such a configuration is useful in ensuring that the attachment modules 14 are properly mounted to the box 12 so as to help properly position the attachment portion 16 of the attachment module 14 to a corresponding mounting structure of the packaging space.

Figure 4A:
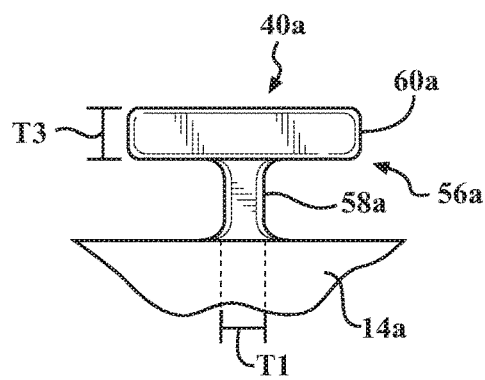
FIG. 4A is an isolated view of a first key.
Figure 4B:
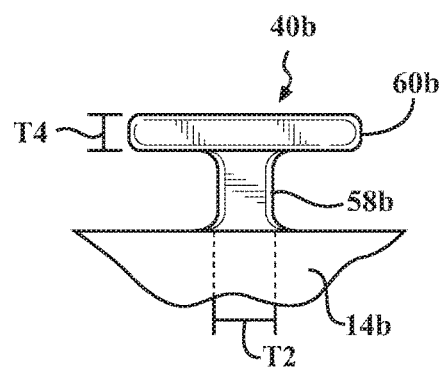
FIG. 4B is an isolated view of a second key.

In one aspect, the keys 40 are a pair of tabs 56a, 56b as shown in FIGS. 4A and 4B. The tabs 56a, 56b are structurally different from each other. Each tab 56 is configured to engage a predetermined first or second slot housing 44, 46. In particular, the tabs 56 include a stem 58 and a tab guide 60. The stem 58 is an elongated member fixed to the inner wall of the attachment module 14. The tab guide 60 is a generally planar member disposed on the stem 56 and generally orthogonal to the stem 58 so as to be spaced apart from the inner wall of the attachment module 14.

The stem 58 has a thickness configured to be received by a slot 54 of a predetermined first or second slot housing 44, 46 as the case may be. For example, FIG. 4A illustrates a stem 58a of attachment module 14a having a thickness T1. FIG. 4B illustrates a stem 58b of attachment module 14b having a thickness T2 which is smaller than the thickness T1 of the stem 58a shown in FIG. 4A. The tab 56 cannot be seated within a slot housing 44, 46 (as the case may be) having a slot 54 with a width smaller than the thickness of the stem 58 of the tab 56.

As the tab 56b has a stem 58b having a thickness larger than the thickness of the stem 58a of the tab 56a, the tab 56b cannot engage the first or second slot housing 44, 46 having a slot 54 configured to fittingly receive stem 58a. As such, the power distribution assembly 10 is configured to ensure that the attachment modules 14 are properly seated with a corresponding mating structure 18 of the box 12.

Likewise, the tab guide 60 has a thickness configured to be received by a pocket 52 of a predetermined first or second slot housing 44, 46 as the case may be. For example, FIG. 4A illustrates a tab guide 60a of attachment module 14a having a thickness T3. FIG. 4B illustrates a tab guide 60b of attachment module 14b having a thickness T4 which is smaller than the thickness T3 of the tab guide 60a shown in FIG. 4A. The tab 56 cannot be seated within a slot housing 44, 46 having a pocket 52 with a width smaller than the thickness of the tab guide 60 of the tab 56.

As the tab 56b has a tab guide 56b having a thickness smaller than the thickness of the tab guide 56a of the tab 56a, the tab 58a cannot engage the first or second slot housing 44, 46 having a pocket 52 configured to fittingly receive tab guide 60a. As such, the power distribution assembly 10 may be configured to ensure that the attachment modules 14 are properly seated with a corresponding mating structure 18 of the box 12 by modifying the thickness of the tab guides 60 and the pockets 52.

Figure 5A:
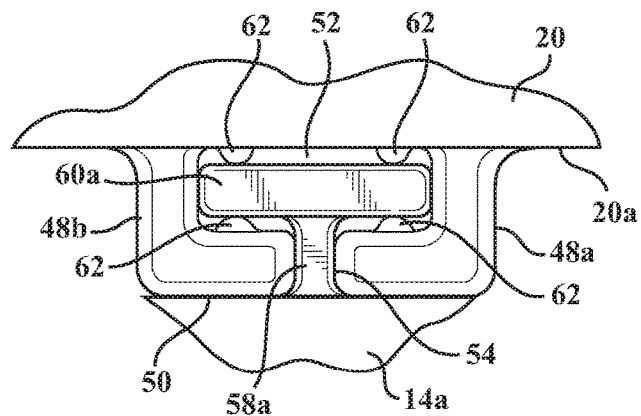
FIG. 5A shows the key in FIG. 4A engaged with a predetermined first slot housing.
Figure 5B:
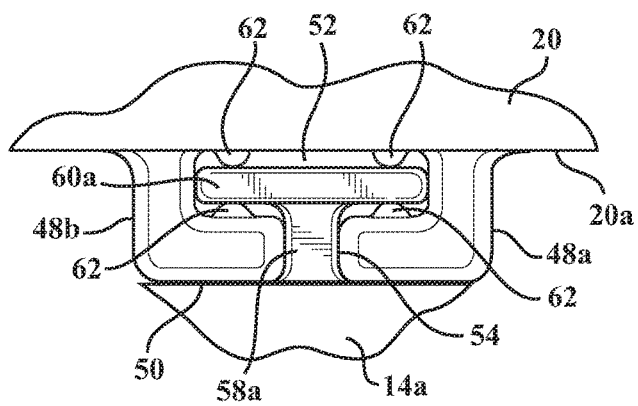
FIG. 5B shows the key in FIG. 4B engaged with a predetermined second slot housing.

With reference now to FIGS. 5A and 5B, a top down view of the key 40A engaged with a first slot housing 44 is provided. FIG. 5A illustrates how the key 40A may be configured to be received in the first slot housing 44 by a combination of the thickness of the stem 58a as well as the thickness of the tab guide 60a. In particular, FIG. 5A depicts how the pocket 52a of the first slot housing 44 is dimensioned to fittingly receive the tab guide 60a so as to engage the tab guide 60a on all sides. Likewise, the slot 54 has a width configured to receive the thickness of the stem 58a. FIGS. 5A and 5B also illustrate how the thickness of the slot side walls 48a, 48b and the front slot wall 50 may be uniform, wherein the width of the pocket 52 is adjusted by the addition of nubs 62 formed on the inner surface of the front slot wall 50 or the outer surface 20a of the box 12 enclosed by the tab 56.

FIG. 5B depicts how the pocket 52b of the second slot housing 46 is dimensioned to fittingly receive the tab guide 60b of the key 40b so as to engage the tab guide 60b on all sides. Likewise, the slot 54 has a width configured to receive the thickness of the stem 58b. FIG. 5A taken in view of FIG. 5B demonstrates how the power distribution assembly 10 ensures the proper attachment module 14 is mounted to a predetermined mating structure 18.

With reference again to FIG. 2, each of the attachment modules 14a, 14b, 14c, 14d includes a leg portion 17. The leg portion 17 is generally orthogonal to the respective attachment bodies 15a, 15b, 15c, 15d. The leg portion 17 works in concert with the respective attachment bodies 15a, 15b, 15c, 15d to wrap around the corresponding corner 30, 32, 34, 36 of the box 12. The leg portion 17 forms a radiused corner 17a with the inner wall of the attachment body 15 so and helps support the attachment modules 14a, 14b, 14c, 14d by distributing the weight of the box 12. The leg portion 17 is further configured to help retain the key 40 in engagement with a respective first or second housing 42a, 42b as the case may be. The leg portions 17 have a width configured to receive a pair of tabs 56. FIG. 2 illustrates how the tabs 56 on the leg portion 17 are spaced apart different distances from a corresponding pair of tabs 56 on the respective attachment portion 16 of the attachment module 14.

In one embodiment, the power distribution assembly 10 includes first and second side wall attachment module 14e, 14f. The box 12 includes a pair of mating structures 18e, 18f disposed on the first and second side walls 22, 24 respectively. The first and second side wall attachment modules 14e, 14f include an attachment portion 16e, 16f As described above, the mating structures 18e, 18f are structurally different from each other. The attachment portions 16e, 16f are also structurally different from each other. The attachment portions 16e, 16f are configured to engage mating structures 18e, 18f. As such, attachment module 14e cannot engage mating structure 18f and attachment module 14f cannot engage mating structure 18e.

In one aspect, the attachment modules 14e, 14f have an attachment portion 16e, 16f with a respective key 40e, 40f. The keys 40e, 40f are a pair of tabs 56 as shown in FIGS. 4A and 4B. The tabs are structurally different from each other. The tabs 56 include a stem 58 and a tab guide 60. The tab guide 60 is a generally planar member disposed on the stem 56 and generally orthogonal to the stem 58 so as to be spaced apart from the inner wall of the respective attachment module 14e, 14f.

The mating features 18e, 18f is guide 42e, 42f disposed on respective first and second side walls 22, 24 of the box 12. The guides 42e, 42f each include a first slot housing 44 spaced apart from a second slot housing 46. The first and second slot housings 44, 46 each have a pair of slot side walls 48a, 48b and a front slot wall 50 spaced apart from an outer surface of the outer wall 20 so as to form a pocket 52 with an open top. The front slot wall 50 includes a slot 54. The slot 54 extends along the longitudinal height of the slot side walls 48 and is generally centered between the slot side walls 48.

In one example, the guide 42e is structurally different than guide 42f by the distance in which the first slot housing 44 is separated from the second slot housing 46. For instance, FIG. 3 shows the first slot housing 44 and the second slot housing 46 of guide 42e spaced apart from each other a distance D5. The first slot housing 44 and the second slot housing 46 of guide 42f spaced apart from each other a distance D6, wherein distance D6 is less than distance D5. The attachment modules 14e, 14f are configured to engage mating features 18e, 18f. As the first and second housings 44, 46 of respective mating features 18e, 18f are spaced apart from each other different distances, attachment module 14e cannot engage with mating feature 18f and likewise attachment module 14f cannot engage with mating feature 18e.

Accordingly, the power distribution assembly 10 is configured to have a common box 12 adaptable for use in various packaging spaces so as to reduce manufacturing costs. In particular, the attachment modules 14 may be manufacture with an attachment portion which is configured to engage a specific mating feature of the box. As such, the power distribution assembly 10 ensures that installers installing the power distribution assembly 10 into a packaging space use the proper attachment module 14.

Further, as the attachment modules 14 are manufactured for a specific packaging space, the power distribution assembly 10 is configured to ensure that the power distribution assembly 10 is mounted to the packaging space properly. For example, FIG. 1 shows the attachment modules 14 having one or two through-bores. The through-bores are positioned so as to ensure that the power distribution assembly 10 is fastened to specific locations of a body structure, for example an attachment bracket in an automotive vehicle.

Further, the power distribution assembly 10 reduces manufacturing costs and increases design flexibility as the box 12 need not be redesigned for different packaging spaces. Instead, only the attachment body 15 of the attachment module 14 needs to be modified to account for a predetermined packaging space whereas the attachment portion may remain the same.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power distribution assembly for housing a connector assembly, the power distribution assembly comprising:
a box having a pair of mating features, the pair of mating features are structurally different than each other;
a pair of attachment modules each of the pair of attachment modules being structurally different and separate from the other, each of the pair of attachment modules having an attachment body and an attachment portion disposed on an inner wall of the attachment body, wherein one of the pair of attachment modules is configured to engage with one of the pair of mating features and the other of the pair of attachment modules is configured to engage with the other of the pair of mating features so as to be independently attached to or removed from the corresponding one of the pair of mating features.

2. The power distribution assembly as set forth in claim 1, wherein the box includes an outer wall having an outer wall surface, the outer wall includes a first side wall, a second side wall, a first back wall and a first front wall so as to define a first corner, a second corner, a third corner and a fourth corner.

3. The power distribution assembly as set forth in claim 2, wherein the pair of mating structures is a first mating structure, a second mating structure, a third mating structure and a fourth mating structure.

4. The power distribution assembly as set forth in claim 3, wherein the pair of attachment modules is a first attachment module, a second attachment module, a third attachment module and a fourth attachment module.

5. The power distribution assembly as set forth in claim 4, wherein the first mating structure, the second mating structure, the third mating structure and the fourth mating structure are disposed on respective first corner, second corner, third corner and fourth corner of the box.

6. The power distribution assembly as set forth in claim 5, wherein each of the first, second, third and fourth attachment modules includes a key, the key is configured to engage a predetermined mating structure, the key disposed on an inner surface of a respective first, second, third and fourth attachment portions of the first, second, third and fourth attachment portions.

7. The power distribution assembly as set forth in claim 6, wherein each of the first, second, third and fourth mating structures includes a pair of guides, wherein each one of the pair of guides includes a first slot housing spaced apart from a second slot housing.

8. The power distribution assembly as set forth in claim 7, wherein the first slot housing and second slot housing of respective first, second, third and fourth mating structures are spaced apart from each other a predetermined distance that is different from each other.

9. The power distribution assembly as set forth in claim 7, wherein each of the first slot housing and second slot housing has a pair of slot side walls and a front slot wall spaced apart from an outer surface of the outer wall so as to form a pocket with an open top, the front slot wall includes a slot, the slot extending along a longitudinal height of the pair of slot side walls and is generally centered between the pair of slot side walls.

10. The power distribution assembly as set forth in claim 9, wherein each of the slots have a width different than each other.

11. The power distribution assembly as set forth in claim 9, wherein each of the pockets have a width different than each other.

12. The power distribution assembly as set forth in claim 9, wherein each of the pockets have a width different than each other.

13. The power distribution assembly as set forth in claim 10, wherein the keys are a pair of tabs, each of the pair of tabs are structurally different from each other.

14. The power distribution assembly as set forth in claim 13, wherein each of the pair of tabs includes a stem and a tab guide, the stem is an elongated member fixed to the inner wall of each of the first attachment module, the second attachment module, the third attachment module and
the fourth attachment module, and the tab guide is a generally planar member disposed on the stem and generally orthogonal to the stem so as to be spaced apart from the inner wall of a respective first, second, third and fourth attachment modules.

15. The power distribution assembly as set forth in claim 13, wherein a thickness of each of the stems is different from each other.

16. The power distribution assembly as set forth in claim 13, wherein a thickness of each of the tab guides is different from each other.

17. The power distribution assembly as set forth in claim 14, each of the first, second, third and fourth attachment modules includes a leg portion, the leg portion is generally orthogonal to a respective attachment body.

18. The power distribution assembly as set forth in claim 16, wherein the leg portion forms a radiused corner with the inner wall of the attachment body.

19. The power distribution assembly as set forth in claim 17, wherein the leg portion has a width configured to receive a pair of tabs.

20. The power distribution assembly as set for in claim 4, further including a fifth mating structure and a sixth mating structure disposed on a respective first side wall and second side wall of the box.

* * * * *